United States Patent [19]

Randall

[11] Patent Number: 5,763,121
[45] Date of Patent: Jun. 9, 1998

[54] LOW DISTORTION STENCIL MASK

[75] Inventor: John Neal Randall, Richardson, Tex.

[73] Assignee: Texas Instruments Incorporated, Dallas, Tex.

[21] Appl. No.: 754,599

[22] Filed: Nov. 20, 1996

Related U.S. Application Data

[60] Continuation of Ser. No. 477,721, Jun. 7, 1995, abandoned, which is a division of Ser. No. 115,954, Sep. 1, 1993, Pat. No. 5,529,862.

[51] Int. Cl.[6] .................................................. G03F 9/00
[52] U.S. Cl. ................................................ 430/5; 430/396
[58] Field of Search ............................ 430/5, 396, 322

[56] References Cited

U.S. PATENT DOCUMENTS

| | | | |
|---|---|---|---|
| 3,742,230 | 6/1973 | Spears et al. | 250/65 R |
| 4,342,817 | 8/1982 | Bohlen et al. | 430/5 |
| 4,468,799 | 8/1984 | Harms et al. | 378/35 |
| 4,647,517 | 3/1987 | Hersener et al. | 430/5 |
| 4,708,919 | 11/1987 | Shimkunas et al. | 430/5 |
| 4,780,382 | 10/1988 | Stengl et al. | |
| 4,827,138 | 5/1989 | Randall | 430/5 |
| 4,855,195 | 8/1989 | Zapka et al. | 430/5 |

*Primary Examiner*—George F. Lesmes
*Assistant Examiner*—Laura Werner
*Attorney, Agent, or Firm*—James E. Harris; James C. Kesterson; Richard L. Donaldson

[57] ABSTRACT

A stencil mask (10) has a membrane (14) under tensile stress and at least one pattern opening (22) formed through the membrane (14). A plurality of stress relief openings (30) are formed in the membrane for reducing stress-induced distortion of the membrane and the mask pattern. The stress relief openings (30) are positioned to relieve concentrations of stress within the membrane (14) such as those resulting from non-regularities within the pattern. In one embodiment, a screening material (56), less rigid than the membrane (14), is contained within the stress relief openings (30).

5 Claims, 4 Drawing Sheets

LOW DISTORTION STENCIL MASK

This application is a Continuation of abandoned application Ser. No. 08/477,721, filed on Jun. 7, 1995, which is a Divisional of application of Ser. No. 08/115,954, filed Sep. 1, 1993, now U.S. Pat. No. 5,529,862 entitled Low Distortion Stencil Mask, by the following inventors: John N. Randall.

TECHNICAL FIELD OF THE INVENTION

This invention relates in general to lithographic techniques used in the fabrication of integrated circuits and, more particularly, to the prevention of stress induced distortions in stencil masks utilized in lithographic processes.

BACKGROUND OF THE INVENTION

In the manufacture of integrated circuits and other electrical devices, lithographic processes are used in which a circuit pattern is exposed on a layer of photoresist formed on a substrate, utilizing radiation of various types. In accordance with techniques well-known in the art, such lithographic processes typically entail development of the exposed resist layer, followed by one or more etching processes in which the exposed areas are removed, whereby a circuit pattern may subsequently be replicated in metal or semiconductor layers beneath the exposed pattern.

Because of the necessity in modern circuit components for precise yet highly miniaturized circuit patterns, such lithographic techniques must produce printed patterns of very high resolution, and conventional photolithographic techniques have proven unsatisfactory in some applications because of inherent technical limitations. Conventional photolithographic techniques achieve sub-micron resolution only with difficulty because of the natural phenomenon of diffraction of light utilized in shadowgraph exposures, which tends to cause poor image quality and a small depth of focus.

Although electron beam and X-ray lithographic techniques exist which are capable of achieving submicron resolution, they involve certain limitations for some applications. For example, in electron beam lithography, when utilized in a high resolution, parallel-printing process, critical dimension control problems are experienced due to a proximity effect inherent in the electron beam process. X-ray lithography tends to be expensive and in general tends to require undesirably long exposure time to expose a resist adequately. X-ray lithography also involves diffraction effects which can limit resolution.

Ion beam lithography is a technique which is capable of producing precise, very high resolution patterns and which is not limited by proximity effect problems such as those of parallel printing electron beam lithography. Moreover, commercially available sources for generating highly collimated, high energy ion beams are substantially less expensive and more effective for exposing resists than even the brightest X-ray sources. However, when used in parallel-printing procedures, ion beams are easily blocked by materials which are considered transparent in the context of conventional photolithography or X-ray lithography. In fact, almost any solid material having a thickness greater than one micron will block the transmission of even high energy, e.g., 100 Kv, ion beams.

If the transmissive areas through which ions are passed are defined by very thin sections of material intended to provide semi-transparent "windows," i.e., sections thinner than one micron, the material tends to cause the ion beams to diverge, even in the case of highly collimated ion beams. In general, such masks are spaced from the surface upon which a pattern is being printed for preventing damage to the surface or the mask. Consequently, because of this spacing requirement and the divergence caused by such semitransparent regions, highly precise patterns often are not obtainable.

DESCRIPTION OF THE PRIOR ART

Several techniques have been utilized in the past for enhancing ion beam lithographic processes and for minimizing technical difficulties such as nuclear scattering effects. Attempts have been made to form the transmissive, "pattern" regions of a mask as transparent windows of very thin material, e.g., as a membrane thinner than one micron, in order to permit transmission of high energy ion beams therethrough. However, nuclear scattering occurs when ion beams are passed through such membranes, and such nuclear scattering increases the energy spread and divergence of the ion beams. Single crystal masks which make use of ion channeling may reduce this effect, but they do not eliminate it. Thus, even very thin, ion channeling membranes achieve less than desirable results due to the nuclear scattering effect.

In a second method, the mask is a grid-like membrane having regularly spaced narrow openings. The portions of the mask which fall outside the transmissive, pattern areas are filled with an opaque filler material. This approach is the subject of U.S. Pat. No. 4,827,138, which is hereby incorporated by reference. Whereas this method may be used advantageously for certain applications, the grid openings in transmissive areas may tend to diffuse and break up the pattern into multiple pixels.

Consequently, masks used in ion beam lithography, as well as e-beam lithography, are often stencil masks, i.e., masks having pattern openings formed completely through the mask membrane. The use of such pattern openings in transmissive areas of the mask is preferable to the use of windows formed of very thin semi-transparent layers of material because ion beams passing through the openings are not subject to nuclear scattering effects. Thus, highly collimated ion beams passing through the openings remain collimated and undiffused.

Attempts have been made to produce precisely formed stencil masks which would permit the successful use of e-beams and collimated ion beams for forming images of very high resolution. However, certain structural characteristics exist in such stencil masks which have tended to cause distortion in the pattern. Typically, the masks are formed of a membrane which is stretched under tension across a supporting frame. Tensional stress is required in such a mask in order to keep the membrane smooth and flat, for maintaining optical parallelism during exposure of the resist layer. Such tensile stress tends to be relieved around voids or openings formed in the membrane, and the non-uniformity of the patterns typically used in the formation of integrated circuits causes such stress relief to be greater in some areas than others. Consequently, the membrane is distorted in a manner tending to equalize the stress, and such distortion limits the precision otherwise obtainable in ion beam or electron beam radiation lithographic procedures.

Additionally, during exposure, radiation which is not transmitted through the pattern openings is absorbed by the membrane. As a result, the temperature of the membrane increases during the exposure step, which causes the membrane to expand further. While attempts have been made to minimize such stress-induced distortion by reducing the initial tensile stress on the mask membrane, a degree of stress is required in order to maintain the planar configuration of the mask throughout the exposure cycle.

Accordingly, there is a need for a stencil type, open pattern mask which is of high dimensional stability and in which tensile stress is distributed substantially uniformly throughout the mask membrane.

SUMMARY OF THE INVENTION

According to one aspect of the present invention, a lithographic stencil mask includes a membrane mounted under tensile stress on a supporting frame in a generally planar configuration. The membrane is provided with a lithographic pattern consisting of at least one pattern opening, and is advantageously formed of a mechanically rigid material such as silicon. Multiple stress relief openings are formed within the non-sacrificial membrane portion, i.e., the portion outside the at least one pattern opening. The positioning and distribution of the stress relief openings in accordance with the present invention results in the relief of stress concentrations induced by the pattern openings, such that tensional stress is not concentrated in one portion of the membrane but instead is substantially evenly distributed there-through.

In one embodiment, the stress relief openings extend completely through the membrane, along respective axes substantially perpendicular to the membrane. In another embodiment, the stress relief openings extend only partially within the membrane, taking the form of cavities formed through a first surface of the membrane and having respective closed ends spaced between the first and second membrane surfaces.

In the first embodiment, the screening material is a material which is softer and more flexible than the membrane material, so that the membrane will not be constrained from flexure by the screening material. In the second embodiment, the portion of the membrane extending beneath the respective cavities is sufficiently thin and flexible to permit stress relief, yet substantially non-transparent to the particular radiation for which the mask is intended. In both embodiments, radiation to be used in subsequent lithographic processes is prevented from passing through the stress relief openings by opaque screening material aligned with the stress relief openings.

The present invention provides several technical advantages over prior lithographic mask structures and methods for forming such masks. Since the mask is a stencil mask having open pattern areas, problems experienced in the past with respect to the nuclear scattering of ion beams or electron beams as they pass through semi-transparent "windows" of thin material are avoided. Another technical advantage is that the dimensions and configurations of the pattern openings are not significantly distorted by the tensile stress applied to the membrane for maintaining it in a planar configuration.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE EMBODIMENTS

Figures 1, 2:
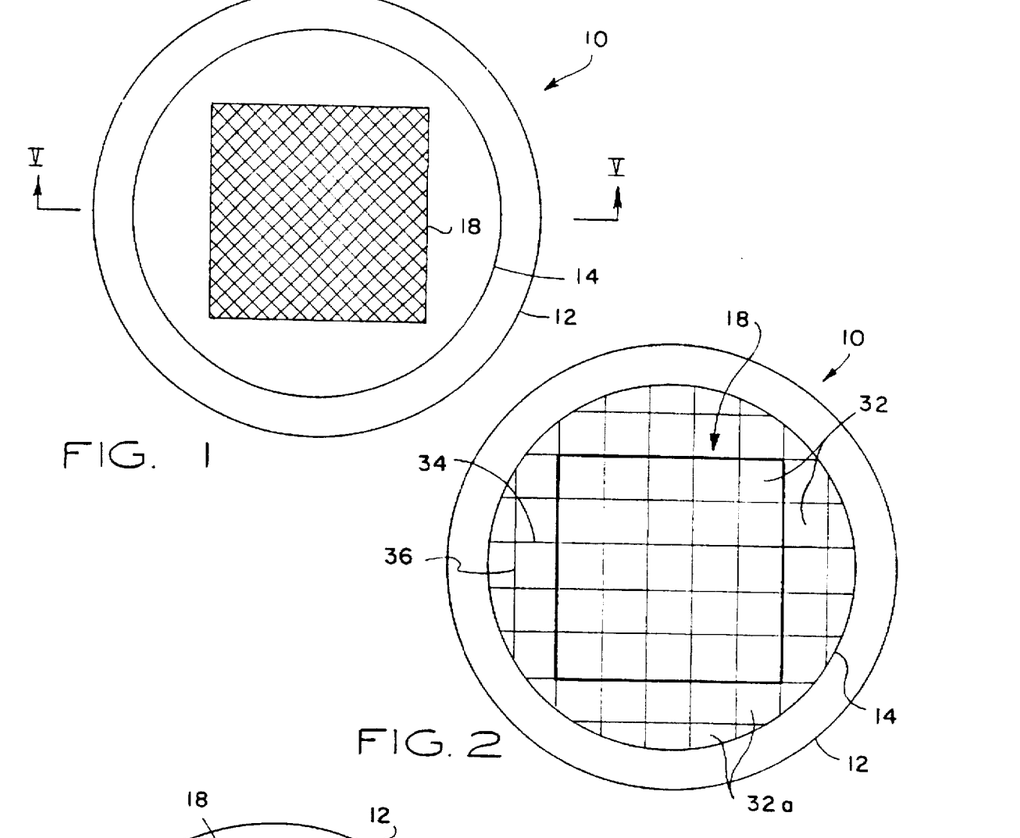
FIG. 1 schematically illustrates in plan an embodiment of the mask of the present invention in an initial stage of its fabrication and processing.
FIG. 2 is a view, similar to FIG. 1, schematically illustrating the definition of a plurality of mask subfields in accordance with one step of the process.

With initial reference to FIG. 1, the mask 10, in accordance with one embodiment of the present invention, includes a rigid, peripherally extending frame portion 12, suitably of circular configuration in plan, and a membrane 14 extending laterally within the frame 12. As may be seen more clearly in FIG. 5, the membrane 14 suitably comprises an integral portion of the frame 12. The frame 12 is preferably secured to an annular sub-frame 16 providing structural support to the frame 12 and membrane. The membrane 14 is maintained under lateral or radially distributed tension, whereby substantially uniform tensile stress is applied to the membrane for maintaining it in a substantially planar configuration, as seen in FIGS. 5–12.

The thickness of membrane 14 is not critical in the present invention, but it is necessarily greater than, and preferably at least twice, that which is necessary to provide a non-transparent barrier to the particular form of radiation or particle beam energy which is to be directed toward the mask and through respective pattern openings in the mask during its intended application in lithographic printing procedures. In one preferred embodiment, in which the mask 10 is adapted for use in an ion beam lithographic process, the membrane 14 is advantageously formed of a monocystalline lattice structure, suitably as a silicon substrate such as those conventionally used in the fabrication of integrated circuits. In one exemplary embodiment, the membrane 14 is approximately two microns in thickness, of five to ten centimeters in diameter, and maintained under a tensional stress of approximately $10^8$ to $10^9$ dynes/cm$^2$. Such masks are commercially available, and one commercial source is Nanostructures Inc.

The membrane 14 preferably includes a small percentage of boron, e.g., about four percent. As shown in FIG. 1, the membrane 14 includes a centrally located pattern area 18 and a peripheral, border region 20 encircling the pattern area 18. In accordance with practices known in the art, the pattern area 18 is that area of the mask in which the lithographic pattern is formed, such patterns normally comprising a plurality of pattern holes or openings, as indicated at 22b in FIG. 4B and at 22d in FIGS. 4B and 4C. The pattern openings 22 are precisely arranged in accordance with the particular pattern which is desired to be replicated by the lithographic procedures in which the mask is to be used, e.g., in ion beam lithographic processes, in accordance with practices generally known in the art. Such patterns may vary in pattern density throughout the pattern area 18.

As previously discussed, because of a tendency of the membrane to be strained unevenly adjacent the pattern openings, some degree of distortion of the membrane, and accordingly, of the pattern, naturally occurs. At least a degree of such distortion is inherent in the mask, because of the tensile stress necessarily maintained on the membrane 14 to maintain it in an essentially planar configuration. Thus, the absence of membrane material in the pattern openings lessens the resistance to strain and lowers the spring constant in those areas. The membrane material thereby tends to stretch and distort adjacent the openings, to relieve the strain.

The degree of distortion depends upon the degree of stress on the membrane and the configuration of the particular pattern. Moreover, irregular patterns, i.e., patterns in which the percentage of the mask occupied by the pattern in one area is substantially greater than the percentage occupied by the pattern in other areas, entail a higher degree of distortion.

In accordance with one preferred embodiment of the invention, as suggested above, the stress relief openings 30 are formed in and distributed throughout the membrane 14 in an arrangement in which such variations in the density of open area, due to variations in the density of the pattern from region to region, are substantially alleviated by the placing of correspondingly higher densities of stress relief openings 30 in those regions having relatively smaller percentages of pattern openings 22, or no pattern openings. Accordingly, the cumulative totals of the cross-sectional areas of openings of both types, i.e., the pattern openings 22 and the stress relief openings 30, are substantially equal, in uniformly sized regions of the mask, due to this compensating distribution of stress relief openings.

Thus, whereas the existence of the pattern openings 22 lowers the spring constant and lessens the resistance to stress of the membrane 14 in those areas, in accordance with the present invention, the incorporation of a plurality of secondary or stress relief openings 30, formed within the membrane in accordance with the method of the present invention, relieves and equalizes tensile stresses within the mask, compensating for any non-uniform distribution of the pattern openings.

Referring now to FIGS. 1-12, in accordance with the first embodiment, the stress relief openings 30 penetrate the membrane and are at least partially filled with a material 56 (FIG. 12) which is opaque to the intended radiation and which is relatively softer and less rigid than the silicon crystalline material of the membrane 14. The "non-pattern" stress relief openings 30 are essentially rendered opaque by the relatively soft, opaque screening material. But the physical stress relief effected by the stress relief openings 30 is substantially the same as that which would occur if the stress relief openings were not filled with the screening material 56 because of the flexible nature of the selected material, as will be discussed hereinbelow.

Referring now to FIG. 2, one preferred method for determining the preferred distribution and placement of the stress relief openings 30 will now be described. In accordance with the method, the membrane 14 is considered as being comprised of a plurality of subfields 32. The subfields 32 are conveniently of square or rectangular configuration, of equal areas, except for the partial subfields which occur at the peripheral regions of the membrane 14 adjacent the frame 12, as indicated at 32a. The subfields 32 are defined by a pattern of x and y loci 34, 36. The size of the subfields is larger than the largest patterns geometry. Otherwise, a subfield could be 100 percent transmissive, which would be untenable. Additionally, in the present embodiment, the x and y dimensions of the subfields 32 are preferably greater than the greatest x and y dimensions of any of the pattern openings 22.

The upper bound of the subfield size is the pattern area 18 itself. In such a case the mask would consist of two subfields, the pattern area 18 and the membrane area outside of the pattern. The size of the subfields may be selected between these limits as required to achieve pattern distortion within the required distortion limits. In general, the smaller the subfields, the lower the distortion in the mask. The optimum subfield size will be pattern and distortion tollerance dependent. Finite element modeling of the masks could be used to determine this optimum size.

Figure 3:
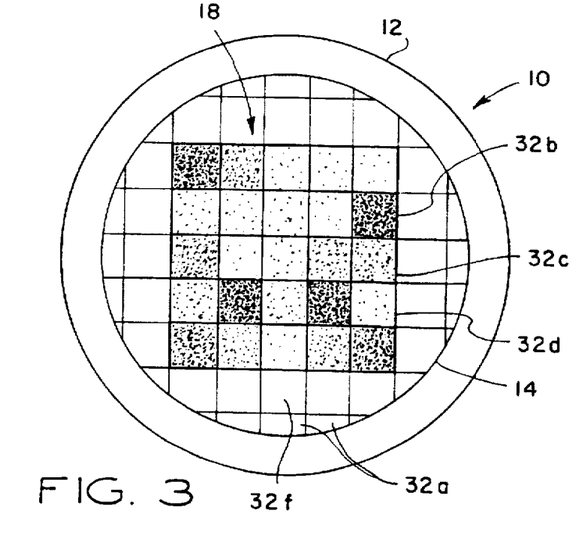
FIG. 3 is a view, similar to FIG. 2, schematically illustrating a subsequent phase of the process.

Referring now to FIG. 3, the subfield pattern, the total or aggregate pattern areas within each respective subfield 32, and the densities of the patterns within the respective subfields, are then determined and stored in a data base. As known to those in the art, circuit patterns replicated in such masks are typically designed by means of Computer Aided Design programs, such as CALMA utilizing formats such as GDS-2 (Graphical Design System available from the Valid Corporation). In the present method, the CALMA program and data base utilized in the design of the particular mask pattern is suitably programmed to provide the above-mentioned data regarding the relative densities of the pattern openings within each of the subfields.

Suitably, the pattern density is computed and mapped by: integrating the dimensional parameters of the respective pattern openings to define their respective areas; summing the areas of the pattern openings within each respective subfield; and dividing each sum by the area of the respective subfield. For simplifying such calculations, the partial, peripheral subfields 32a may be ignored, since there are no pattern openings therein. Such programming techniques are well known to those skilled in the art, and will therefore not be described in detail herein.

Figure 4A:
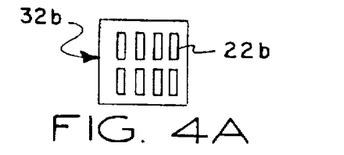
FIGS. 4A and 4B are enlarged, schematic representations of respective sections of the mask, as in FIG. 3, illustrating arrays of pattern holes formed in the respective subfields.
Figure 4B:
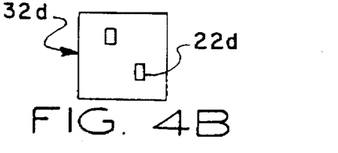

Utilizing such CAD programming techniques, the subfields are thus classified as being of varying degrees of pattern density. As represented schematically in FIG. 3, subfield 32b is of a high pattern density; subfield 32c is of intermediate or moderate density; and subfield 32d is of relatively low density. Subfield 32b is schematically represented in an enlarged scale in FIG. 4A, wherein the pattern openings 22b to be formed therein are shown to occupy a substantial percentage, e.g., 20 percent, of the total area of the subfield. Similarly, subfield 32d is schematically indicated in FIG. 4B, wherein its pattern openings 22d occupy only a small percentage of the area of the subfield, e.g., 3.0 percent.

Next, the CAD program is used to determine the number of stress relief openings 30 required to be formed in each subfield 32 for relieving localized concentrations of stress. In accordance with one embodiment, the preferred distribution is one in which the aggregate totals of the cross-sectional areas of the stress relief openings 30 in each subfield 32, added to the totals of the cross-sectional areas of the pattern openings 22 in the respective subfields, are substantially uniform in uniformly sized subfields throughout the mask. Thus, the cumulative totals of both pattern and stress relief openings in each full subfield 32 are approximately equal and are equal to the area of the pattern openings in the densest pattern, e.g., that of subfield 32b.

In implementing the present method, wherein it is sought to equalize the densities of openings in each of the subfields, there are certain practical limits to the parameters employed.

For example, as in all stencil masks, certain patterns, such as those having very large pattern openings, or forbidden geometry (e.g., "doughnut holes") may require the use of techniques such as the use of multiple exposures using complementary masks, as known in the art. Grid support masks may be required for some patterns having excessively large or open patterns. The use of such methods is thus effective, in most mask patterns, to permit hole densities in the subsections of approximately 50 percent, providing an acceptable distribution of tensile stress utilizing the above-disclosed process.

Figure 4C:
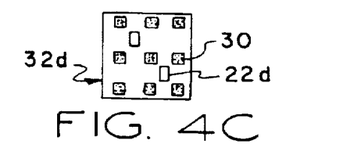
FIG. 4C is a schematic representation of the mask subfield of FIG. 4B as it is configured in a subsequent stage of the process.

With reference to FIG. 4C, a schematic representation is provided of the pattern resulting from the above-discussed process as applied to subfield 32d, of low initial density. Stress relief openings 30 are distributed throughout the subfield 32d and around the pattern openings 22d. The aggregate total of the cross-sectional areas of the stress relief openings 30 is substantially greater than the total area of the pattern openings 22d. In contrast, in "pattern dense" subfields such as subfield 32b, no stress relief openings are added. Accordingly, the resulting, aggregate area of the stress relief openings 30 and the pattern openings 22d to be formed in subfield 32d (FIG. 4C) is substantially equal to that of the pattern openings 22b to be formed in "dense" subfield 32b (FIG. 4A).

For example, to equalize the open areas in subfield 32b (20 percent pattern density) and subfield 32d (three percent pattern density), the aggregate area of stress relief openings 30 allocated to subfield 32d is equal to about 17 percent of the total area of subfield 32d. With respect to the non-pattern subfields, such as 32f and 32a (FIG. 3), which have no pattern openings, an even greater density of stress relief openings 30 is allocated, again corresponding to the density of pattern openings 22b to be formed in pattern-dense subfield 32b. It may now be seen that, in accordance with the present embodiment, the pattern densities of the subfields 32 become substantially consistent.

Having thus formulated a nominal pattern or layout for the mask 10, the layout is then examined to determine whether any of the stress relief openings 30 are in overlapping relation with one of the pattern openings 22, or whether the stress relief openings are so close to one of the pattern openings as to compromise the structural integrity of the membrane 14. If so, the alignment of the stress relief openings 30 may be shifted slightly to alleviate such potential structural problems. Additionally, the alignment of individual stress relief openings 30 may be shifted, if necessary, to alleviate such positioning problems. To the extent practicable with the particular pattern, the openings 22, 30 should be substantially equally spaced.

Whereas the above-described method is advantageously utilized in many applications, it should be recognized that various modifications in the method may be desirable for certain masks having unusual pattern designs. For example, in masks having excessively elongated pattern openings, or openings extending predominately along one axis, it may be desirable additionally to increase the pattern density of stress relief openings in subfields longitudinally aligned with such elongated pattern openings.

Having thus determined the preferred layout of the mask 10, the pattern openings 22 and stress relief openings 30 are physically formed in the membrane 14, as will now be described with reference to FIGS. 5–12. It should be understood that the drawing figures are not necessarily to scale, and that, in particular, the thicknesses of layers 46, 44 and the diameters of openings 22, 30, 48 and 50 have been greatly exaggerated for clarity of description. In summary, the openings 22, 30 are advantageously formed by serial exposure of a resist layer by an electron beam lithography apparatus, the stress relief openings 30 and the pattern openings 22 being advantageously formed under the control of a common pattern generation program.

Figure 5:
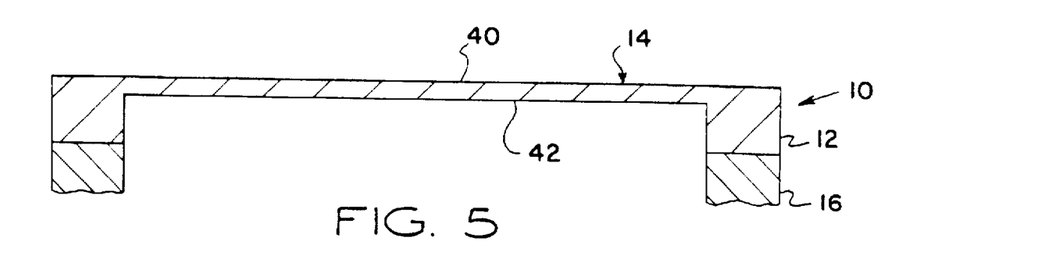
FIGS. 5–12 are cross-sectional representations of the mask of FIGS. 1–4 illustrating sequential process steps utilized in one embodiment of the invention.
Figure 6:
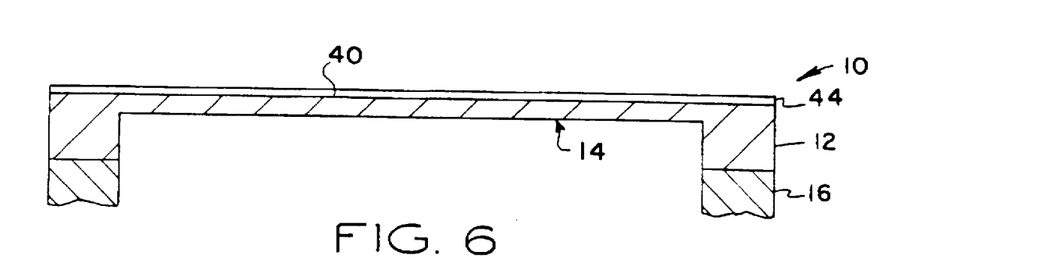

With initial primary reference to FIG. 5, silicon membrane 14 has a first, upper surface 40, polished and cleaned, and a second, lower surface 42. Referring now to FIG. 6, a buffer or "etch stop" oxide layer 44 is initially formed on the upper surface 40 of the membrane 14. The oxide layer 44 is suitably grown on the membrane by a conventional vapor deposition process and is suitably of a thickness of about 50 nm.

Figure 7:
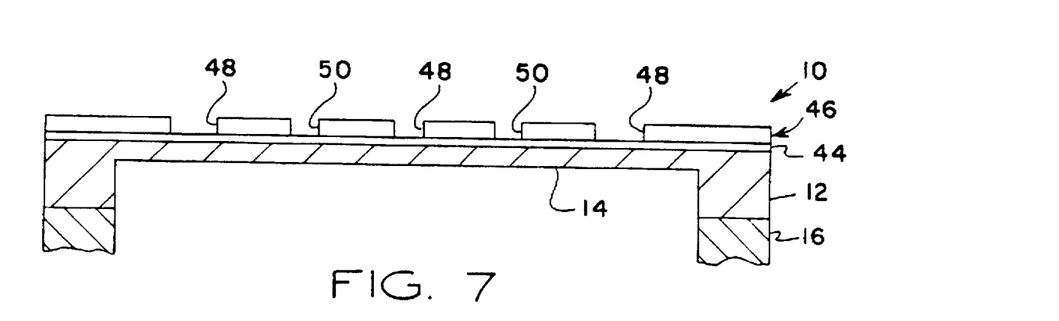

Referring now to FIG. 7, an electron beam resist layer, such as polymethylmethacrylate resist (PMMA), is then spun coated over the oxide layer 44 to a thickness of approximately 0.5 microns. The PMMA resist is then selectively exposed by an electron beam lithography machine which, as indicated above, preferably writes both the pattern openings and the stress relief openings in the resist, in accordance with the methods described above with reference to FIGS. 1–4C. Resist layer 46 is then developed in a mixture of methyl isobutyl keytone and isopropyl alcohol, removing the resist in the areas of the pattern openings and the stress relief openings, as indicated at 48 and 50, respectively, in FIG. 7.

The use of e-beam lithography for serially defining patterns within a resist layer, and the development of such resists, is generally known to those in the art and is not described in detail herein. For example, such processes are disclosed in the previously referenced U.S. Pat. No. 4,827,138, which has been incorporated by reference.

Figure 8:
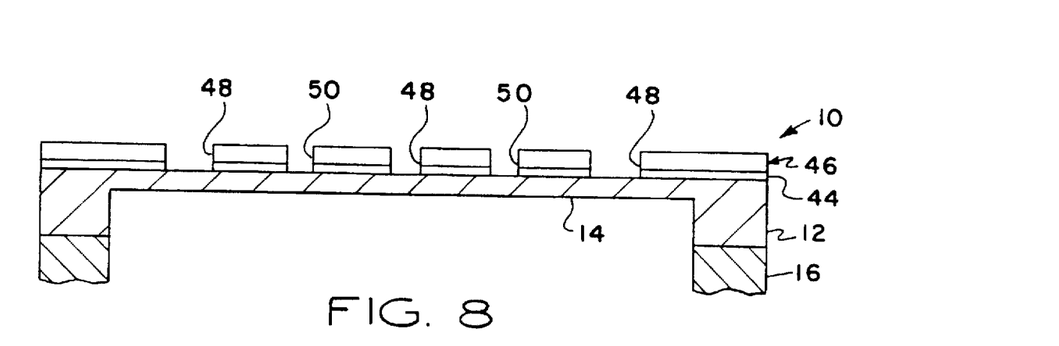

With added reference to FIG. 8, the developed resist pattern is then replicated or transferred to the silicon dioxide coating by a reactive ion etching (RIE) process utilizing $CBrF_3$ as an etchant gas. The etching process is substantially an isotropic process utilizing reactive ion etching, such reactive, dry etching processes being preferred for this application because of their precisely controlled etching reaction, whereby precisely dimensioned openings, having substantially vertical walls, are defined.

Figure 9:
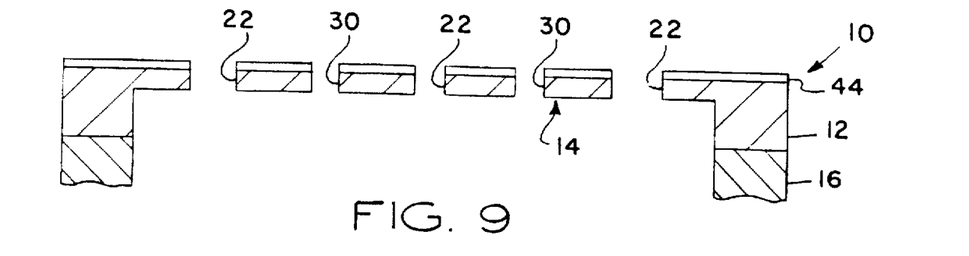
Figure 10:
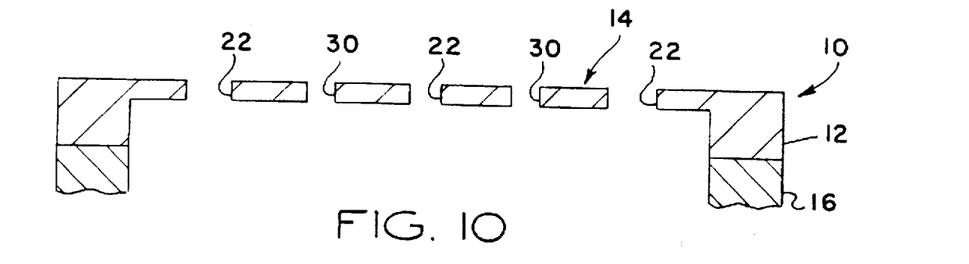

Subsequently, the resist 46 is removed by a suitable solvent such as acetone, and the mask 10 is again placed within the reactive ion etching chamber, utilizing bromine ($Br_2$) as the etching gas, for transferring the pattern to the silicon membrane 14 by extending openings 50 through the oxide layer 44 and the membrane 14 to form the stress relief openings 30 (FIG. 9), and extending openings 48 through the oxide layer and the silicon membrane to define the pattern openings 22 (FIG. 9). One example of such an etching procedure is described in "Low Stress Silicon Stencil Masks for Sub-100 nm Ion Beam Lithography," F.O. Fong, et al., *Proceedings of Microcircuit Engineering* (1989). The oxide layer 44 is then removed, suitably with a hydroflouric acid etch, thereby providing the mask structure as seen in FIG. 10, wherein both the pattern openings 22 and the stress relief openings 30 are formed through the membrane 14 as vertically walled openings.

At this stage, the mask 10 would not be suitable for use in lithographic processes because the stress relief openings 30 remain open and would therefore leak radiation utilized in such lithographic processes. Accordingly, screening material 56 (FIG. 11) is utilized for optically blocking the stress relief openings 30. The screening material 56 is necessarily of a material which is softer and substantially less rigid than the membrane material, and it is chosen to have benign mechanical properties when compared with the mechanical properties of the silicon crystal lattice structure of the membrane.

Figure 11:
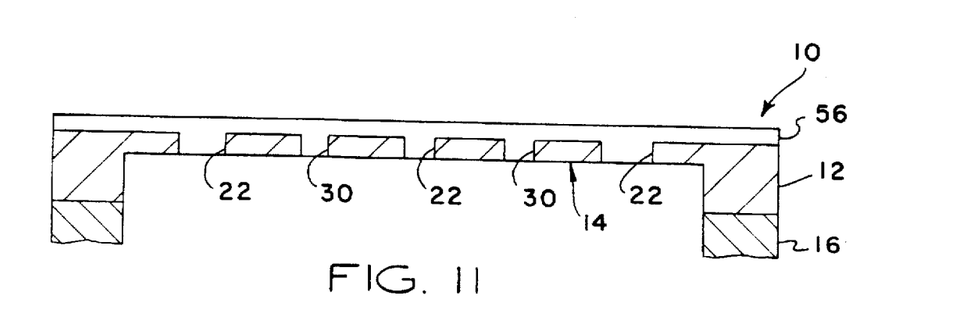

Referring to FIG. 11, an organic polymer material 50 such an electron-beam resist material, such as PMMA, is suitably utilized. It is suitably applied by being spin coated onto the mask membrane 14, filling both the pattern openings 22 and the stress relief openings 30. Subsequently, the soft, organic resist material 56 is removed from the pattern openings 22 by exposing those portions of the resist layer 56 in and around the respective pattern openings 22, and developing the resist to remove the portions within and above the pattern openings 22.

Figure 12:
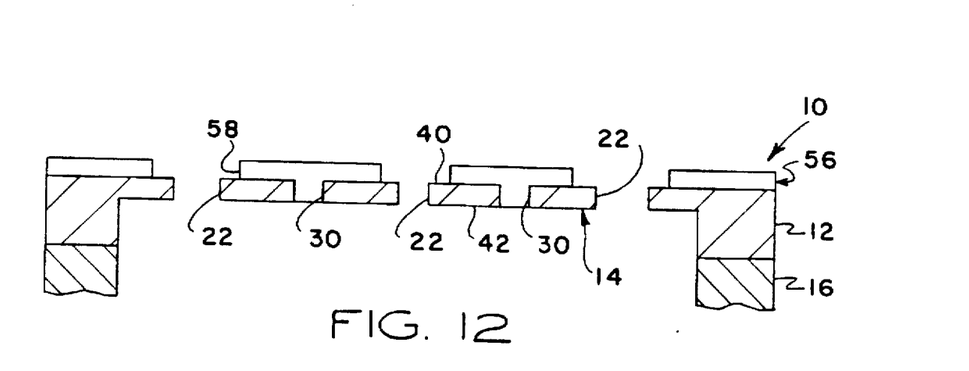

As shown in FIG. 12, the electron beam exposure of the pattern hole areas 22 may extend laterally beyond the pattern openings 22, whereby the areas of the resist screening material 56 which are exposed and removed adjacent the pattern openings 22 may be somewhat wider than the corresponding pattern openings, as indicated at 58. Thus, the exposed areas 58 of the resist layer 56 need not be precisely aligned with the pattern opening 22, provided adjacent stress relief openings 30 are not thereby exposed, since the pattern of the mask 10 is defined by the openings 22 formed through the silicon membrane 14 and not by the openings 58.

The portions of the screening material 56 extending over the membrane 14 generally do not substantially affect the mechanical properties of the membrane 14 and may be permitted to remain, as shown in FIG. 12. However, if they are of sufficient thickness to constrain the membrane 14 substantially, they may tend to affect the spring constant of the membrane 14, and they are therefore removed, suitably by a plasma etch process utilizing oxygen.

In general, such relatively soft materials have an insignificant effect upon the physical properties of the mask. Depending upon the degree of stiffness of the particular material, however, it is possible that in some applications, as in very high resolution masks, it may be preferable to change the stress relief openings size and/or number to compensate for any change in spring constant caused by the screening material 56. Suitably, the resist 56 is then covered by a few hundred Angstroms of a protective coating, such as an oxide, or metal film to stabilize the resist against degradation during ion bombardment.

The stress relief openings 30 need not be completely filled with the soft screening material 56, so long as sufficient quantities thereof are present in each of the stress relief openings 30 to block the radiation intended to be used during application of the mask in lithographic processes. For example, a quantity of organic polymer of only about 100 nm in thickness is effective to block 10 Ke V protons typically utilized in ion beam lithography.

Whereas the process as thus far described entails the use of a positive resist 56, alternatively, a negative resist, not shown, can be utilized, in which case the areas in and around the stress relief openings 30, rather than the pattern openings 22, would be exposed during the electron beam resist exposure step. Again, some oversizing of the openings would be permissible.

In the above discussion, it is assumed that an e-beam resist could act as the filler material. In some instances it may be advantageous to use a different filler material. In such cases the filler material of choice could be deposited on the mask and in the mask holes then selectively removed from the pattern holes by an e-beam patterning step and subsequent etching procedure. Such a process is described in the referenced U.S. Pat. No. 4,827,138.

It should also be noted that stress relief holes in portions of the membrane which are not irradiated by the ion beam do not necessarily have to be filled.

Figure 13:
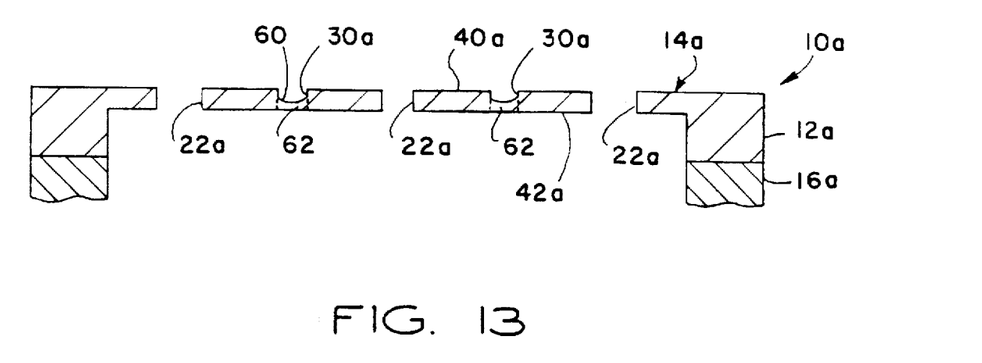
FIG. 13 is a view, similar to FIG. 12, schematically illustrating a mask having stress relief openings formed in accordance with another embodiment of the invention.

In the embodiments thus far described, the stress relief openings 30 are extended completely through the membrane 14, substantially perpendicularly. With reference now to FIG. 13, in another embodiment, the stress relief openings, designated 30a, are extended only partially within the membrane 14a, whereby they define respective cavities opening through the upper membrane surface 40a and having respective closed end portions 60 located between the upper and lower membrane surfaces 40a, 42a. This cavity-shaped configuration of stress relief openings 30a is suitably effected, during dry reactive etching of the openings 30a, by terminating the dry reactive etching process prior to penetration of the membrane 14a.

The non-sacrificial portions 62 of the membrane 14a remaining beneath the respective cavity openings 30a need only be sufficiently thick to block the intended radiation to be utilized in the subsequent lithographic processes. For example, crystalline silicon of approximately 0.1 micron or greater is of sufficient thickness to substantially block protons of 10 Ke V energy levels. In accordance with this embodiment of the method, the cavity-shaped stress relief openings 30a are sufficiently deep to effect substantial stress relief of the membrane, i.e., to lower the spring constant of the membrane 14a adjacent the openings 30a sufficiently to substantially relieve inconsistent stresses in the membrane caused by the pattern openings 22a, as in the embodiment described with reference to FIGS. 1–12.

Typically, it is preferred that the cavity-shaped stress relief openings 30a extend sufficiently such that the non-sacrificial portions 62 adjacent the respective stress relief openings 30a are of respective thicknesses less than about 10 percent of the membrane thickness. If very high mask resolution and accuracy is required, it may be desirable to form the openings 30a slightly larger, of a diameter sufficient to compensate for the small degree of increase in spring constant added by the respective non-sacrificial membrane portions 62.

In summary, the present invention provides a low distortion tensile mask particularly suited for use in high resolution lithographic procedures such as ion beam lithography. Because the mask pattern is defined by pattern openings, as in a stencil mask, rather than by thin, semi-transparent layers of a crystalline material utilized as windows, the mask does not distort or diffuse highly collimated ion beams, or other forms of radiation. The stress relief openings 30, 30a serve to relieve excessive localized tensional stress and to distribute tensional stresses evenly throughout the mask membrane 14, whereby stress induced pattern distortion is substantially reduced. Since the soft, screening material utilized in the first embodiment is much less rigid than the membrane material, it has substantially no effect on the physical properties of the membrane 14. Further, heating of the membrane 14 and the screening material 56 during exposure of the mask to radiation during a lithographic process tends to cause the filler material to expand vertically, and to remain flexible. Nevertheless, the screening material 56 serves effectively to optically block transmission of the radiation.

Although the present invention and its advantages have been described in detail with respect to several exemplary embodiments thereof, it should be understood that various changes, substitutions, and alterations can be made herein without departing from the spirit and scope of the invention as defined by the appended claims.

What is claimed is:

1. A lithographic stencil mask for selectively transmitting radiation comprising:
 a planar membrane held in tensile stress and having a plurality of pattern openings and a plurality of stress relief openings formed therein,
 said pattern openings formed through said membrane and distributed non-uniformly in size and position across said membrane,
 said stress relief openings formed at least partially through said membrane and positioned so as to not overlap with said pattern openings,
 said stress relief openings distributed across said membrane so as to equalize tensile stress across said membrane; and
 a screening means aligned with said stress relief openings for blocking passage of radiation through said stress relief openings.

2. The mask of claim 1, wherein said stress relief openings extend only partially through said membrane, such that said screening means comprises the remaining portion of said membrane contained within said stress relief openings.

3. The mask of claim 1, wherein said stress relief openings extend completely through said membrane, and wherein said screening means at least partially fills said stress relief openings.

4. The mask of claim 3, wherein said membrane is constructed of a first material and said screening means is constructed of a second material, said second material being less rigid than said first material.

5. A lithographic stencil mask for selectively transmitting radiation comprising:
 a planar membrane held in tensile stress and having a plurality of pattern openings and a plurality of stress relief openings formed therein,
 said pattern openings formed through said membrane and distributed non-uniformly in size and position across said membrane,
 said stress relief openings formed at least partially through said membrane and positioned so as to not overlap with said pattern openings,
 said stress relief openings distributed across said membrane so as to equalize across said membrane the area percentage of said membrane containing either pattern or stress relief openings, thereby equalizing tensile stress across said membrane; and
 a screening means aligned with said stress relief openings for blocking passage of radiation through said stress relief openings.

* * * * *